United States Patent [19]

Ohta et al.

[11] Patent Number: 6,060,780
[45] Date of Patent: May 9, 2000

[54] SURFACE MOUNT TYPE UNIT AND TRANSDUCER ASSEMBLY USING SAME

[75] Inventors: Tameharu Ohta, Nishio; Tomohito Kunda, Nukata-gun, both of Japan

[73] Assignee: Denson Corporation, Kariya, Japan

[21] Appl. No.: 08/804,718

[22] Filed: Feb. 21, 1997

[30] Foreign Application Priority Data

Feb. 23, 1996 [JP] Japan ..................................... 8-036353
Dec. 24, 1996 [JP] Japan ..................................... 8-344025

[51] Int. Cl.$^7$ ................................................ H01L 23/12
[52] U.S. Cl. ........................... 257/731; 257/733; 361/760
[58] Field of Search ................................... 257/642, 731, 257/733, 735, 736; 361/731, 760, 768, 773; 427/96

[56] References Cited

U.S. PATENT DOCUMENTS

| | | |
|---|---|---|
| 5,388,459 | 2/1995 | Inoue et al. . |
| 5,503,016 | 4/1996 | Koen . |
| 5,514,899 | 5/1996 | Lau et al. .............................. 257/423 |
| 5,554,806 | 9/1996 | Mizuno et al. . |
| 5,639,696 | 6/1997 | Liang et al. ............................ 437/209 |
| 5,724,728 | 3/1998 | Bond et al. ............................. 29/840 |

FOREIGN PATENT DOCUMENTS

| | | |
|---|---|---|
| 631 461 | 12/1994 | European Pat. Off. . |
| 62-150837 | 7/1987 | Japan . |
| 5-13667 | 1/1993 | Japan . |
| 5-218134 | 8/1993 | Japan . |

OTHER PUBLICATIONS

The Engineering Society for Advancing Mobility Land Sea Air and Space International, At International Congress and Expositio–Detroit, Michigan, Feb. 27 – Mar. 2, 1995 "New Accelerometer Based on Innovative Packaging and Circuit Design" D.W. de Bruin et al.

*Electronics Mounting Technology* (vol. 10 No. 8, 1994, 8) "Bump Mounting Technology for Passive Chip".

*Journal of Metallurgical Society of Japan* vol. 23, No. 12, 1984 "Microsolder Bonding Technology for IC,LSI".

*Primary Examiner*—Olik Chaudhuri
*Assistant Examiner*—Douglas A. Wille
*Attorney, Agent, or Firm*—Pillsbury Madison & Sutro LLP

[57] ABSTRACT

A surface mount type semiconductor package is mounted on a printed board by bonding, by means of solder bumps signal electrodes, electrically connected to respective terminals of a semiconductor chip incorporated in the package, with lands provided on the printed board. On a mount surface of the package, there are provided auxiliary electrodes formed as electrodes which are not electrically connected to the respective terminals of the semiconductor chip and have a thickness greater than that of the signal electrodes. As a result, solder thickness is secured for the solder bumps between each signal electrode and corresponding land by the difference in thickness between the auxiliary electrode and the signal electrode.

25 Claims, 10 Drawing Sheets

FIG. 14
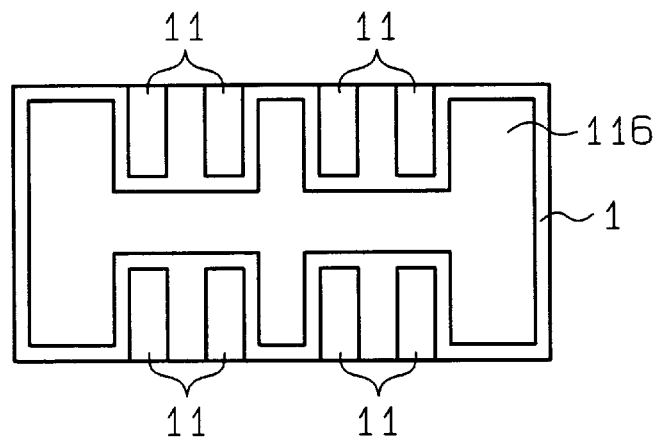
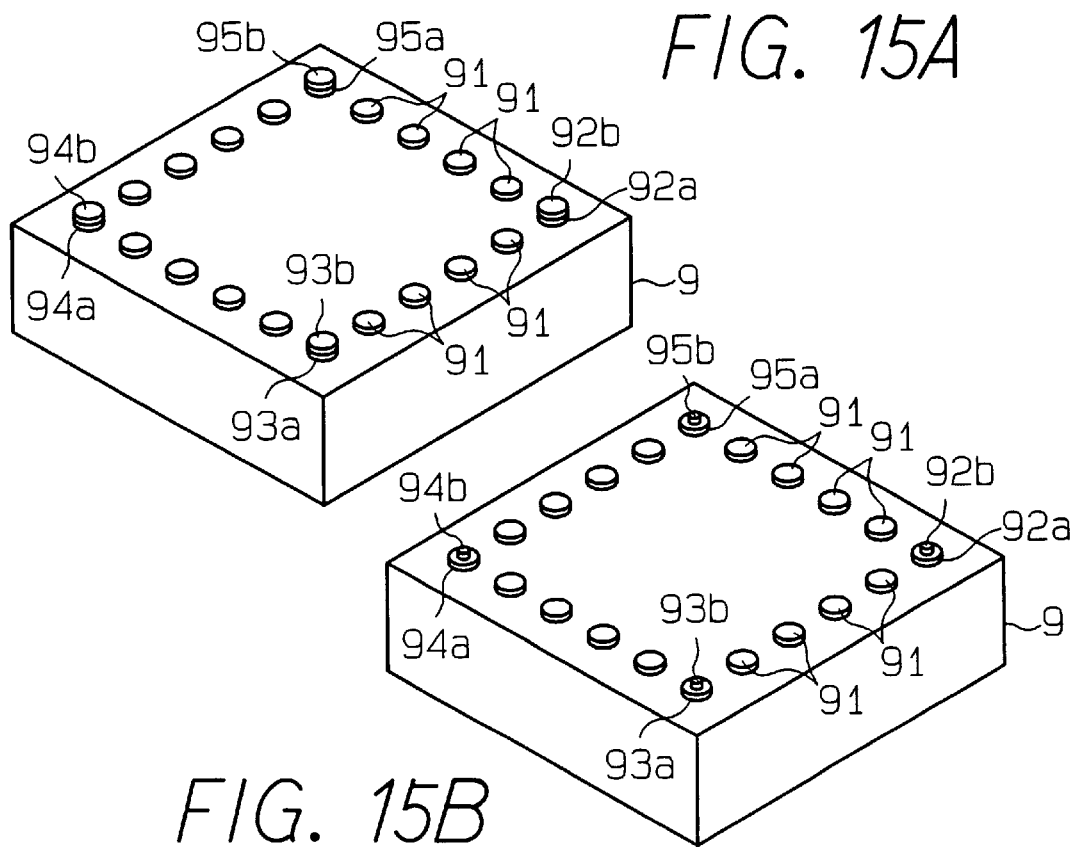
FIG. 15A
FIG. 15B

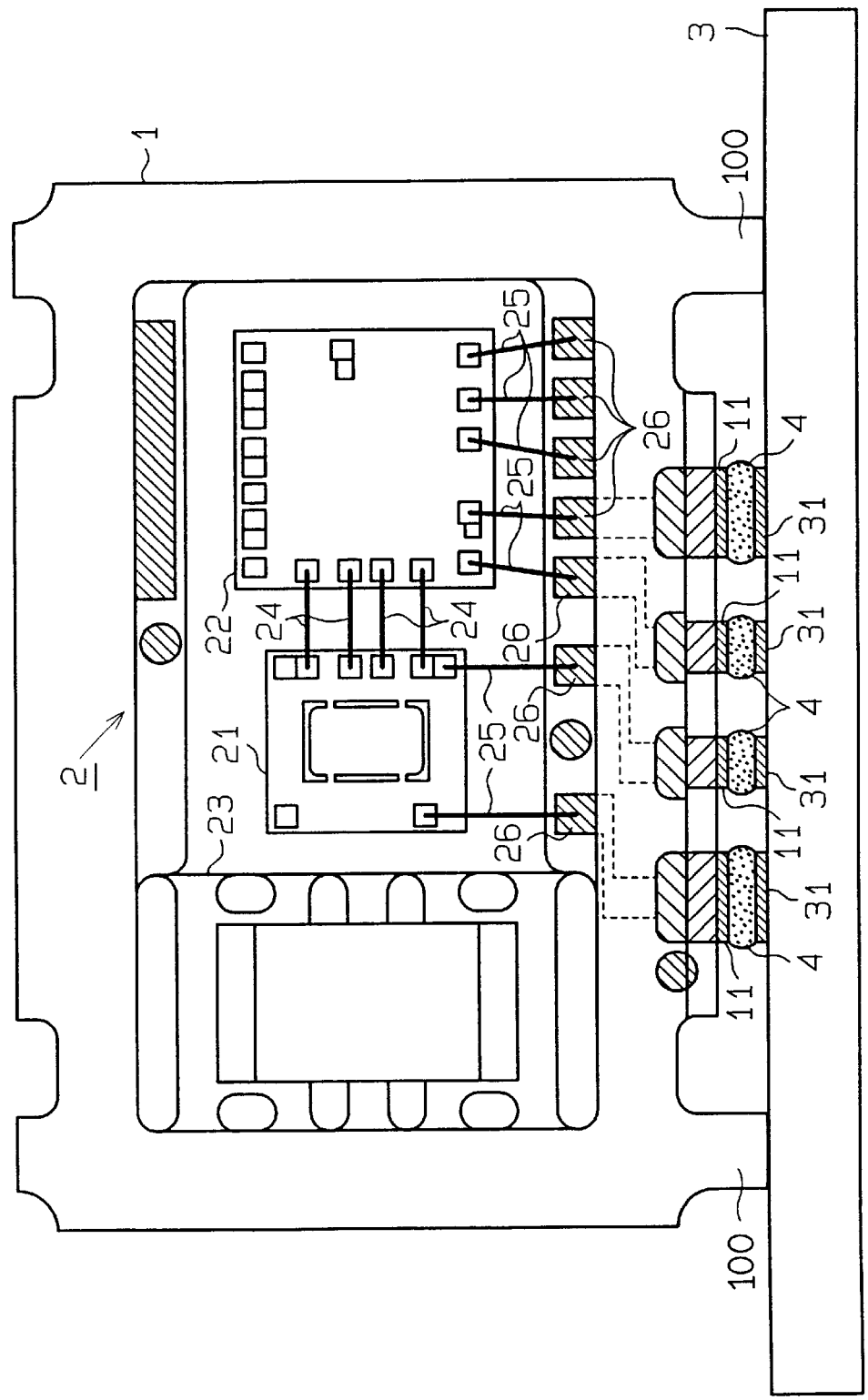

“6,060,780”

SURFACE MOUNT TYPE UNIT AND TRANSDUCER ASSEMBLY USING SAME

CROSS REFERENCE TO RELATED APPLICATION

This application is based upon and claims priority from Japanese Patent Applications No. Hei.8-36353 filed Feb. 23, 1996 and No. Hei.8-344025 filed Dec. 24, 1996, the contents of which are incorporated herein by reference.

BACKGROUND OF THE INVENTION

1. Field of the Invention

The present invention relates to a surface mount type unit to be surface-mounted on a substrate and a transducer assembly using the same, and more particularly to a unit structure useful for reliably mounting a large self-weighted device, such as a large semiconductor package, and a transducer assembly structure using the same.

2. Related Art

Conventionally, various methods involving wire bonding, tape carrier bonding, or flip-chip bonding, or others have been known as techniques for mounting in high density a semiconductor package, such as an IC, LSI, etc., on a printed board.

In particular, since surface mounting by flip-chip bonding is a method in which the semiconductor package is directly bonded on a printed board through fine solder bumps, attention has been recently drawn to this method as a technology for enabling high-density mounting. There is illustrated as a reference in FIGS. 16A and 16B one example of such a surface mount type semiconductor package as well as a state of mounting the same on a printed board.

As shown in FIG. 16A, such a surface mount type semiconductor package 9 usually has in a backside thereof a number of signal electrodes 91 which are electrically connected to input/output terminals or electricity supply terminals of an inside semiconductor device. And, these electrodes 91 and component mounting lands (substrate electrodes) 31 provided on the printed board 3 are to be placed into bonding through solder bumps 4 in a manner shown in FIG. 16B. Incidentally, to surface-mount the semiconductor package 9 through the solder bumps 4, a reflow method using a solder paste is generally adopted.

Although this reflow method is categorized as hot air reflow, infrared-ray reflow, vapor-phase soldering, and so on, basically in either case the semiconductor package 9 is mounted in a procedure of:

(1) a solder paste is print-applied to lands 31 on the printed board 3. Incidentally, there may be a case that the same paste is print-applied also to the signal electrodes 91 side of the semiconductor package 9;

(2) the semiconductor package 9 is mounted by positioning onto the print-applied solder paste on the printed board 3;

(3) in this state, the solder is melted by heating, to bond in batch each of the lands 31 and each of the signal electrodes 91.

According to the surface mounting of a semiconductor package as above, higher density of mounting becomes possible by an amount of unnecessary mount areas for wires or tape carriers or the like, compared to the above-stated wire bonding or tape carrier bonding.

Furthermore, in the wire bonding or tape carrier bonding, the signal electrodes are disposed on an outer periphery of the package and accordingly the number of connectable electrodes are naturally limited. On the other hand, in the case of the surface mount type semiconductor package, the signal electrodes can be disposed on the entire surface of the bottom of the package. Therefore, the restriction in the number of connectable electrodes is greatly relieved. Consequently, according to the surface mount type semiconductor package, the mount density on a printed board can be greatly improved and the number of connectable electrodes is drastically increased, realizing an extremely efficient mount structure.

However, being effective mount structure as above, the integration for semiconductor devices further proceeds as the recent electronics technology rapidly advances and their packages become larger, giving rise to the following new problem resulting from the self-weight of the package.

That is, if the self-weight of the package increases, the solder thickness at the joined portions between the signal electrodes and the lands (substrate electrodes) is thinned and thermal stresses of the joined portions have been increased. The increase of thermal stresses eventually causes the joined portions to be disconnected, etc., becoming a factor of impairing the reliability for the joined portion.

As a result, for an apparatus such as an electronic control device installed on an automotive vehicle, placed in severity of temperature change or vibration and requiring high reliability, the adoption of such a semiconductor package and a mount structure thereof have been rendered difficult.

Incidentally, as seen in electronic component mount structures described in Japanese Patent Application Laid-Open No. Hei. 5-218134 or Japanese Patent Application Laid-Open No. Hei. 7-74450, if balls or spacers or the like are separately disposed between an IC chip or a leadless component and a substrate, the thinning of the solder thickness at the joined portions becomes certainly avoided.

However, in this case, auxiliary members such as these balls or spacers or the like as well as the process for providing the auxiliary members are separately required, imposing large bearing in respect of device cost as well as manufacturing cost and naturally complicating the mount structure thereof.

SUMMARY OF THE INVENTION

The present invention has been made in view of such circumstances, and its object is to provide a surface mount type unit which while simple in structure is capable of mounting the device with high reliability, even if it is large in self-weight.

In order to attain such an object, the present invention adopts a structure of a surface mount type unit in which signal electrodes to be electrically connected to each terminal of a device which is housed in a package and auxiliary electrodes not to be electrically connected to each terminal of the device are respectively provided on a mount surface of the package, and the auxiliary electrodes are formed as electrodes with a thickness thicker than the signal electrodes.

According to such a package structure for a surface mount type package unit, when the same package is rested on a circuit board, a gap corresponding to "auxiliary electrode thickness–signal electrode thickness" becomes formed between the signal electrode and the corresponding land on the circuit board. As a result, if solder bonding according to the above-stated reflow method is subjected to such a package structure, the gap formed therebetween is filled by solder. Accordingly, a sufficient solder thickness corresponding to the distance of the gap is secured at least between the signal electrode and the corresponding land on the circuit board.

Therefore, even if the package has a great self-weight, there is no occurrence of thinning of solder thickness in the joined portion between the signal electrode and the corresponding land on the circuit board, making possible surface mounting of the package with high reliability.

Furthermore, since such a mount structure is realized based on the electrode structure of the package itself without the necessity of auxiliary members such as balls or spacers or the like, there is no imposition of cost burdening and mounting is extremely easy.

Incidentally, although it is needless to say that for such a package structure the additional provision of the lands on the circuit board correspondingly to the auxiliary electrodes is effective for enhancing the mount strength or securing the increased solder thickness between the signal electrode and the corresponding land on the circuit board as stated above, it is not essential for the package to arrange lands correspondingly to the auxiliary electrodes on the circuit board side.

That is, the auxiliary electrode per se is an electrode which does not provide contribution to transmit electrical signals at all so that there is no inconvenience even if this electrode, after being mounted onto the package circuit board, be in electrical suspension. Also, even when the lands are additionally provided on the circuit board correspondingly to the auxiliary electrodes, the present invention lies in the first place in securing the solder thickness between the signal electrode and the corresponding land by the sacrifice of solder bonding at the auxiliary electrode portion. Therefore, the reliability of solder bonding at the auxiliary electrode may be satisfactorily low. As long as the solder thickness between the signal electrode and the corresponding land is sufficiently secured as stated above, the necessary and satisfactory reliability for the joined portions is secured, for example, the mount strength of the package even if solder bonding is not necessarily done at the auxiliary electrode.

Conversely, if the provision of the lands corresponding to the auxiliary electrodes is omitted, it becomes possible to use as it is an existing circuit board previously designed and manufactured for a conventional package having no auxiliary electrodes.

Also, if adopted is the structure that the auxiliary electrodes are formed in a two-layer structure having a first auxiliary electrode film-formed on the package so as to have the same film thickness as the signal electrode and a second auxiliary electrode film-formed overlying the first auxiliary electrode, then it also becomes possible to arbitrary adjust the solder thickness between the signal electrode and the corresponding land on the circuit board.

In this case, the second auxiliary electrode may be formed to have a film thickness of 20 $\mu$m or greater. As a result, the solder thickness between the signal electrode and the corresponding land on the circuit board becomes secured at this 20 $\mu$m or greater, and reliability becomes secured at the joined portion to the same extent as reliability provided to existing surface mount components regardless of the self-weight of a package.

Meanwhile, the auxiliary electrodes may be selectively formed with respect to peripheral portion of the mount surface of the package. In this case, the balance of resting is provided through the auxiliary electrodes formed at the peripheral portion during mounting by positioning the package onto the circuit board according to the above-stated reflow method or the like. As a result, there naturally is less occurrence of such inconvenience that the package is mounted in an inclined state resulting from variation in amount of flowing melt solder.

The above-stated mount structure becomes extremely significant for the package in which a dynamical amount detecting element is housed in the package so that a detection axis of the dynamical amount detecting element is in parallel with the mount surface of the package.

That is, where the package is uprightly mounted like this, its self-weight per unit area usually becomes great and the above-stated thinning of solder thickness becomes apt to occur at the joined portion of the signal electrode and the corresponding land. However, according to the mount structure of the present invention that the auxiliary electrodes are formed as an electrode having a film thickness thicker than the signal electrode, the thickness of solder at the joined portion of the signal electrode and the corresponding land is preferably secured even for such a package and the lowering of reliability resulting from the thinning of the solder thickness is positively avoided.

Also, in such a mount structure, the auxiliary electrodes may be selectively formed close to a shorter side of the mount surface of the sensor package to be mounted upright, stable resting balance is maintained also for this case only due to the auxiliary electrodes formed close to the shorter side of the package mount surface upon resting the package by positioning onto the circuit board in mounting of the package according to the above-stated reflow method for example. As a result, an accurate mount angle is obtained free from effect due to variation of the above-mentioned solder flowing amount or the like for the above dynamical amount sensor wherein particularly raised is a problem of mounting angle such as setting a dynamical-amount detecting angle.

Still further, the auxiliary electrodes may be formed in a two-layer structure having a first auxiliary electrode film-formed on the package to have the same film thickness as the signal electrode and a second auxiliary electrode film-formed overlying the first auxiliary electrode wherein at least the second auxiliary electrodes are selectively formed with respect to four corners of the mount surface of the sensor package to be mounted upright. As a result, the stabilization of resting balance of the package is further strengthened and the mounting angle becomes more accurate.

Furthermore, in this mount structure, when lands corresponding to the auxiliary electrodes are additionally provided on the circuit board and the area of the first auxiliary electrode is larger than that of the second auxiliary electrode, the strength of mounting is further raised due to a preferable solder thickness secured even at exposed portions of the first auxiliary electrodes. Considering that such a dynamical amount sensor, such as an accelerometer or yaw-rate sensor, is installed principally on a moving body such as an automotive vehicle, the significance of strengthening the mount strength is by no means low. Nevertheless, in the package structure, the provision of the lands corresponding to the auxiliary electrodes is not essential, as stated above.

According to the transducer assembly using the surface mount type package unit, even with a high self-weighted package, a conductive bonding element with a preferable thickness can be formed at a joined portion between a conductive element formed on a mount surface of the package and the corresponding conductive element on a circuit board. Therefore, it is possible to obtain the transducer assembly in which the package is surface-mounted on the circuit board with high reliability. Further, the lowering in sensitivity in a detection direction can be suppressed by securing the stability of the package to the circuit board and stabilizing the axis of sensitivity with respect to the surface of the circuit board.

Also, the transducer assembly having the package structure according to the present invention can be adopted with sufficient allowance for a device package, such as a sensor package for an accelerometer mounted upright to align the detecting axis and requiring high reliability even in severity of environmental temperature change or vibration.

Furthermore, since the transducer assembly having such a mount structure is realized based on the electrode structure of the package itself without necessity of auxiliary members such as balls or spacers or the like, there is no imposition in cost bearing and mounting of the package is extremely easy.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

FIG. 14 is a plan view showing a seventh arrangement example of auxiliary electrodes;

FIGS. 15A and 15B are perspective views showing another example of the package structure of the present invention;

FIG. 17 is a front view of a unit structure according to a third embodiment of the present invention.

PREFERRED EMBODIMENTS OF THE INVENTION

Figure 1:
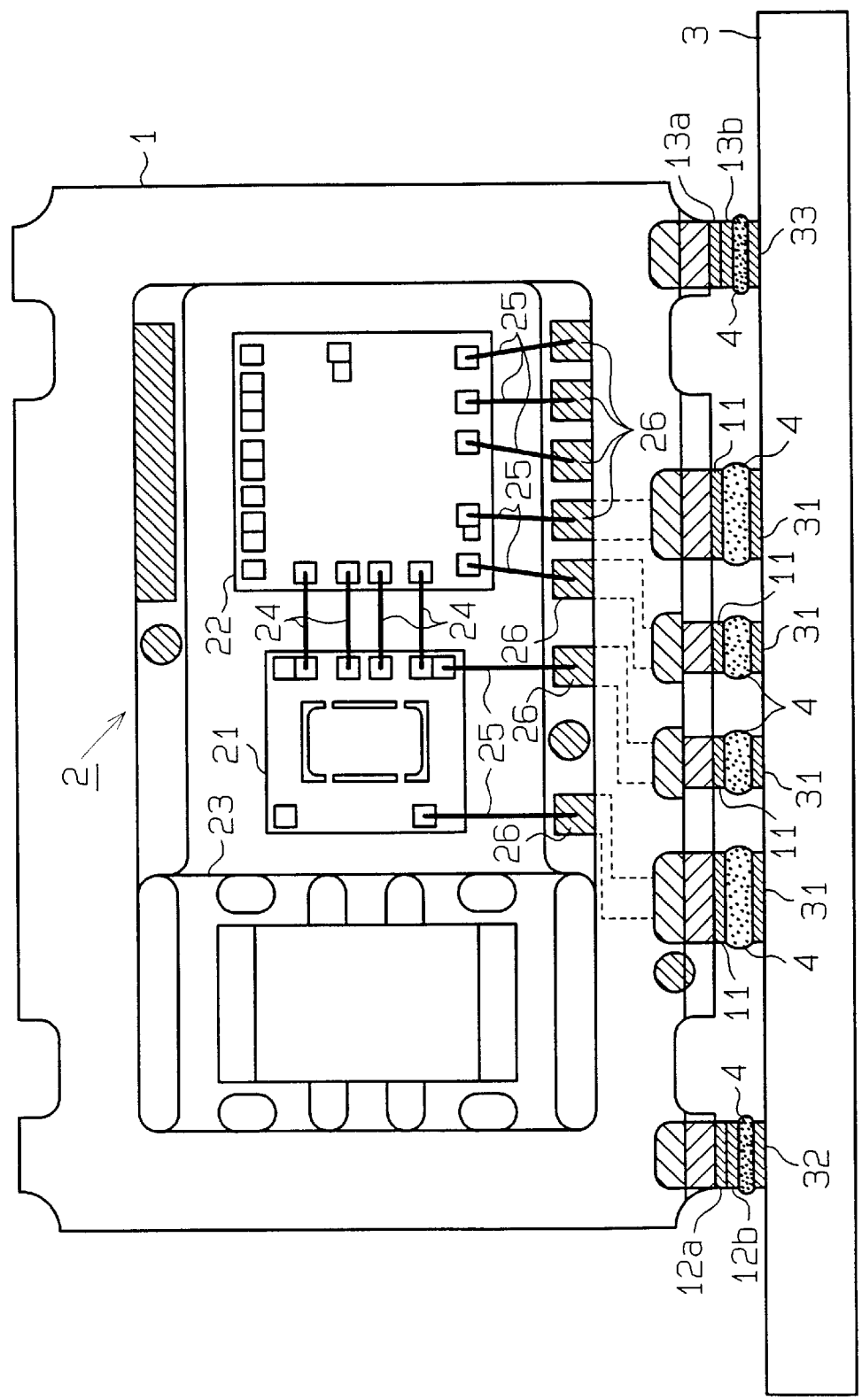
FIG. 1 is a front view of a package structure according to a first embodiment of the present invention.
Figure 2:
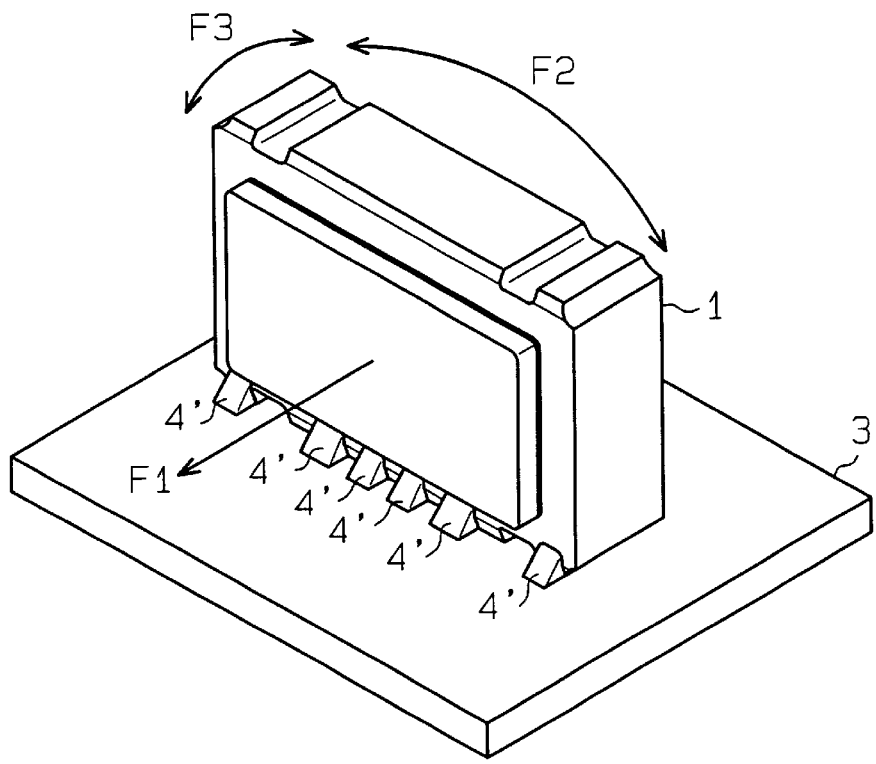
FIG. 2 is a perspective view of the package surface-mounted to a board.

There is illustrated in FIG. 1 and FIG. 2 a first embodiment of a surface-mount type package unit according to the present invention.

The surface-mount type package unit of the first embodiment is structured on the assumption that the package structure according to the present invention is applied to a sensor package of an accelerometer installed, for example, on a moving body such as an automotive vehicle for detecting acceleration thereof.

The package structure of the first embodiment will be explained hereinbelow with reference to FIGS. 1 and 2.

As shown in FIG. 1, this sensor package (semiconductor package) 1 houses therein an accelerometer 2 as a semiconductor device.

The accelerometer 2 is a well known sensor basically including an acceleration detecting element 21 possessing a beam structure, a signal processing circuit 22 for signal-processing acceleration signals from the detecting element 21 representing acceleration of the moving body to be detected based on the displacement of the beam, and a capacitor 23 for signal processing, and so on.

Incidentally, in the accelerometer 2 constructed as above, since in order to prevent deterioration of detecting accuracy due to vibrations, etc. generated in the moving body there is the necessity that the beam structure of the acceleration detecting element 21 be perpendicularly arranged relative to the direction of acceleration to be detected, the package 1 itself incorporating the same is mounted upright relative to a circuit (printed) board 3 as shown in FIGS. 1 and 2. Naturally in this case, the printed board 3 is arranged horizontally to an electronic control device, etc. of the moving body. In this connection, in FIG. 2 the arrow F1 denotes a moving direction of the moving body, i.e., an acceleration detecting axis of the accelerometer 2.

The accelerometer 2 as a transducer chip has the acceleration detecting axis (axis of sensitivity) F1 perpendicular to the surface thereof.

Also, the acceleration detecting element 21 and the signal processing circuit 22 are electrically connected through wires 24. The package 1 embeds therein interconnects 26 which have exposed portions at one ends electrically connected through wires 25 to the acceleration detecting element 21 and the signal processing circuit 22. The other ends of the interconnects 26 are connected to signal electrodes 11 formed on a surface in an underside of the package 1. The output signal of the accelerometer 2 is taken out to the signal electrodes 11 through the wires 24, 25 and the interconnects 26.

In the meanwhile, in a case where the sensor package 1 is uprightly mounted relative to the printed board 3 in this manner, it has significantly increased self-weight per unit area.

When the self-weight of the package 1 is great, the solder thickness at joined portions to the printed board 3 becomes thin and there becomes increase of thermal stress in the same portion, as was stated before.

Further, it was stated hereinbefore that the reliability at the joined portions is greatly spoiled, e.g., there is disconnection being apt to occur due to increase of thermal stresses at the joined portions.

Therefore, in the surface-mount type semiconductor package unit according to the first embodiment, as shown in FIG. 1, besides the signal electrodes 11 to be electrically connected to each terminal of the accelerometer 2, auxiliary electrodes 12 (12a, 12b) and 13 (13a, 13b) which are not electrically connected to each of these terminals are separately provided so that the solder thickness of a solder bump 4 between the signal electrode 11 and the corresponding land 31 on the printed board 3 is secured by the difference in film thickness between the auxiliary electrode 12 and 13 and the signal electrode 11.

The auxiliary electrodes 12 and 13 each are structured to have a two-layer structure which has a first auxiliary electrode 12a and 13a with a thickness equal to the signal electrode 11 and a second auxiliary electrode 12b and 13b for adjustment of the solder thickness. When the package 1 is rested on the printed board 3 there is formed between the signal electrode 11 and the corresponding land 31 on the printed board 3 a gap corresponding to (auxiliary electrode 12, 13 thickness–signal electrode 11 thickness). That is, there is formed a gap corresponding to the film thickness of the second auxiliary electrode 12b and 13b.

Accordingly, if solder bonding for example due to the above-stated reflow method is provided for the package structure as above, the gap portion formed between the signal electrode 11 and the land 31 is filled by a solder bump 4 so that a sufficient solder thickness is secured corresponding to the distance of the gap at least between the signal electrode 11 and the corresponding land 31 on the printed board 3.

Furthermore, actually, solder bumps 4 are allowed to be filled during solder bonding, as shown in FIG. 1, between the auxiliary electrodes 12 and 13 and auxiliary electrode lands 32 and 33 formed on the printed board 3 correspondingly thereto. As a result, the solder thickness between the signal electrode 11 and the corresponding land 31 is further added by a thickness of solder filled between the auxiliary electrodes 12 and 13 and the auxiliary electrode lands 32 and 33.

Therefore, even if the package 1 has a large self-weight, there is no occurrence of thinning of solder thickness as stated before at the joined portion between the signal electrode 11 and the corresponding land 31, making possible surface-mounting of the package 1 with high reliability.

Incidentally, in the package unit of the first embodiment, since there are formed portions with so-called "wetting" in the side portions of the package corresponding to the electrodes 11, 12 and 13, there are remaining solders 4' in a sawed form termed fillets as shown in FIG. 2. But it is natural that according to the above package structure sufficient mounting strength and reliability are naturally secured even by a solder bonding only with the above-stated solder bumps 4 without requiring fillet 4'.

In the first embodiment package, a ceramic substrate for example is employed as a material for the sensor package 1. Tungsten or the like for example, having a linear expansion coefficient close to the ceramic substrate, is used as a material for the signal electrode 11 and auxiliary electrodes 12 and 13. In this case, thermal stresses between the package 1 and each electrode 11, 12 and 13 can be reduced to a minimal degree, so that the reliability for the joined portions can be enhanced further in cooperation with the package structure.

Thus, the sensor package 1 incorporates therein the accelerometer (transducer chip) 2 with the axis of sensitivity F1 perpendicular to the surface thereof. The package 1 has the mount surface (bottom surface in FIG. 1) perpendicular to the surface of the accelerometer 2. On the mount surface, there are formed the signal electrodes 11 (conductive elements) for taking out an output signal of the accelerometer 2. The mount surface of the printed board 3 and the mount surface of the package 1 are faced in a state that the axis of sensitivity F1 is in parallel with the mount surface (top surface in FIG. 1) of the printed board (circuit board) 3, and the auxiliary electrodes (conductive elements) 12, 13 with a greater thickness than the thickness of the signal electrodes 11 are arranged on the mount surface of the sensor package 1. A transducer assembly is completed in the above-described manner.

In the transducer assembly, the sensor package 1 has the wires 24, 25, the interconnects 26, and the signal electrodes 11, for taking out an output signal of the accelerometer 2 to the mount surface, the auxiliary electrodes (conductive elements) 12, 13 with a greater thickness than the thickness of the signal electrodes 11 as conductive elements on the package mount surface placed between the mount surface and the surface of the printed board 3 having lands (conductive elements) 31 in the mount surface thereof, and the signal electrodes 11 and the lands 31 connected through the solder bumps 4 (conductive bonding elements) in a state that the axis of sensitivity F1 becomes in parallel with the mount surface of the printed board 3.

Figure 3:
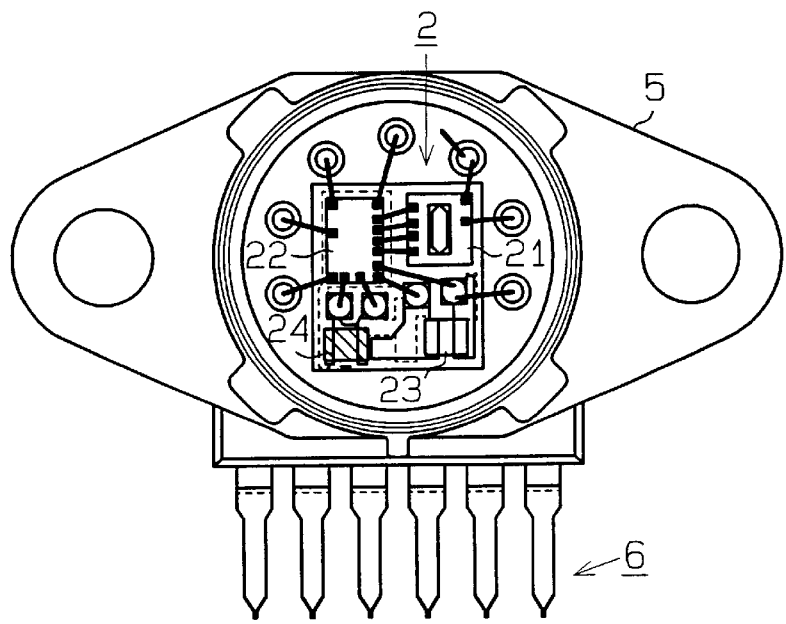
FIG. 3 is a front view showing a structure of a conventional accelerometer.
Figure 4:
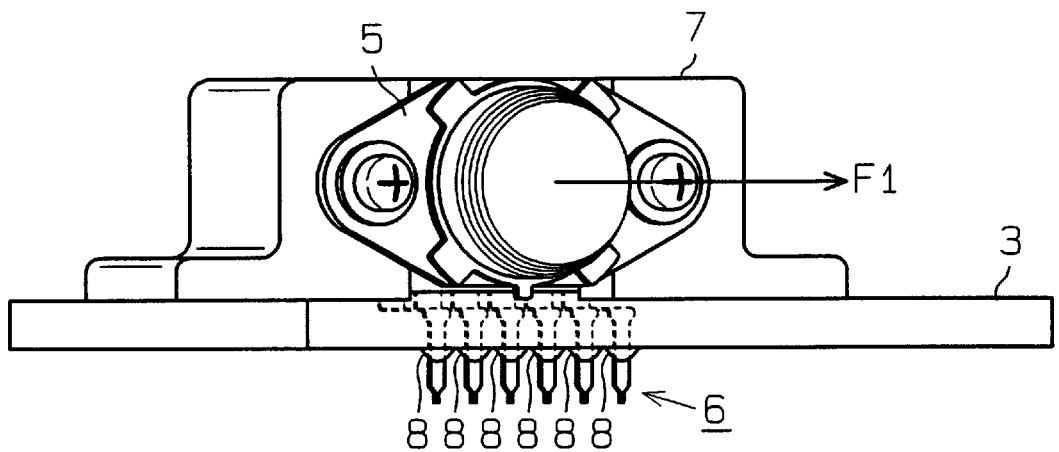
FIG. 4 is a perspective view showing the conventional accelerometer mounted to a board.

FIGS. 3 and 4 exemplify a structure of an accelerometer, as well as an embodiment of mounting thereof, which have been developed by the present inventors prior to the present application.

That is, the accelerometer 2 as sown in FIG. 3 is structured by installing within a sensor housing 5, besides an accelerometer 21 with a beam structure stated above, a signal processing circuit 22 for signal-processing acceleration information on a moving body to be detected based on the displacement of the beam thereof, a capacitor 23 for signal processing, and resistors 24 for adjustment of sensitivity, and so on.

And, signal lead pins 6 electrically connected to each terminal of the accelerometer 2 extends from the sensor housing 5. They are subjected as shown in FIG. 4 to processes during mounting onto the printed board 3 as:

(1) assembling (screw fastening) the sensor housing 5 onto an appropriate auxiliary member 7 for self-standing rectangularly relative to the printed board 3;

(2) inserting the signal lead pin 6 into corresponding connection holes of the printed board 3 to mount the sensor housing 5 together with the auxiliary member 7 onto the board 3; and (3) electrically and mechanically connecting the inserted signal lead pin 6 to the printed board 3 by soldering from the backside of the printed board 3.

Incidentally, also in FIG. 4, the arrow F1 represents the direction of movement of the moving body on which the accelerometer 2 is mounted, i.e., the acceleration detecting axis on the accelerometer 2.

In the accelerometer 2 thus constructed, it is essential as stated above to assemble the accelerometer to the auxiliary member 7 in order that the sensor housing 5 is oriented to align the acceleration detecting axis F1 to the moving direction of the moving body. As a result, the efficiency of component-mounting onto the printed board 3 is significantly hindered, the mounting structure thereof has to be complicated by itself, and operation of mounting is inevitably troublesome.

In this respect, according to the above package structure shown in FIGS. 1 and 2, the adoption of the surface-mount structure greatly improves the efficiency of component-mounting (mount density) onto the printed board 3 with the mounting structure thereof significantly simplified. Also, the adoption of the above-stated solder reflow method provides great simplification in mounting operation for the sensor package.

Furthermore, according to the package structure as mentioned above, while the mount structure is of mounted upright, with a large self-weight per unit area, sufficient mount strength and reliability is secured at least at the joined portions between the signal electrodes 11 and the corresponding lands 31 on the printed board 3, so that it provides suitable mounting for apparatuses, such as electronic control devices, etc., installed on an automobile and requiring high reliability, even under severe environmental temperature changes or vibrations.

Next, explanation will be made of one example of a manufacturing process for a desired manufacturing method for obtaining the package structure of the first embodiment as stated, by referring to FIGS. 5A to 5D, 6A and 6B.

Figure 5A:
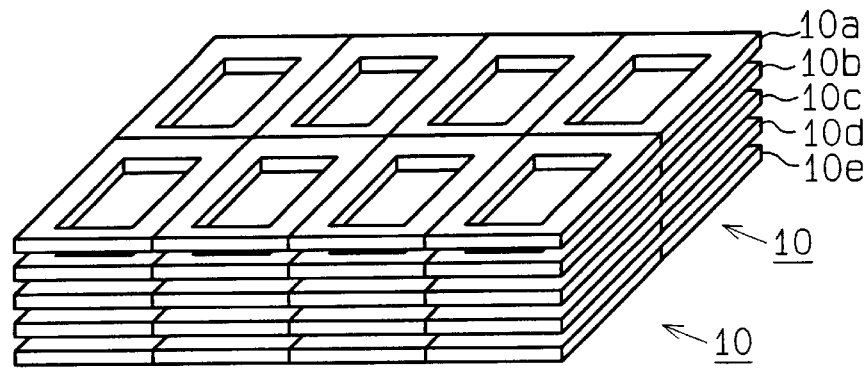
FIGS. 5A to 5D are perspective views showing the manufacturing process for the package.

In the manufacture of the package 1, ceramic substrates 10a to 10e are firstly blanked in a manner as shown in FIG. 5A and bonded together as a package substrate body 10 group. Thereafter, each ceramic substrate forming the substrate bodies 10 are subjected in batch to interior interconnections for incorporating the above-stated accelerometer 2. Incidentally, in the FIG. 5A, the showing is of the interior interconnections is omitted.

Figure 5B:
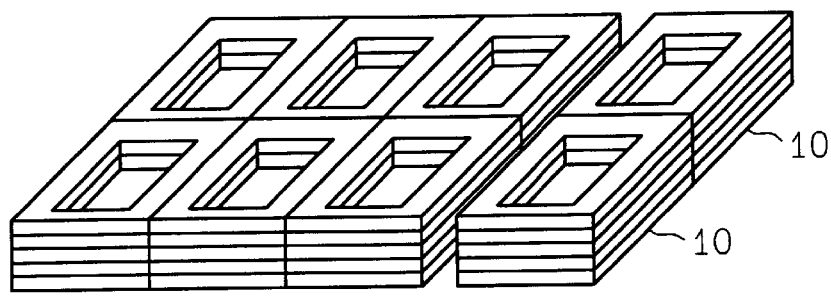
Figure 5C:
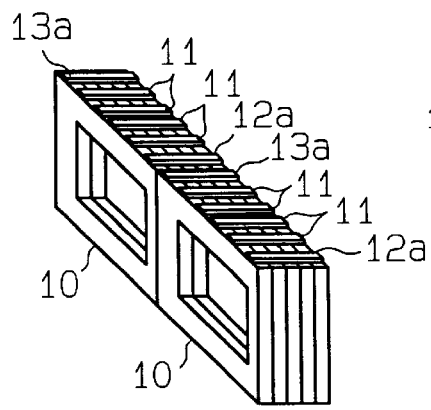
Figure 5D:
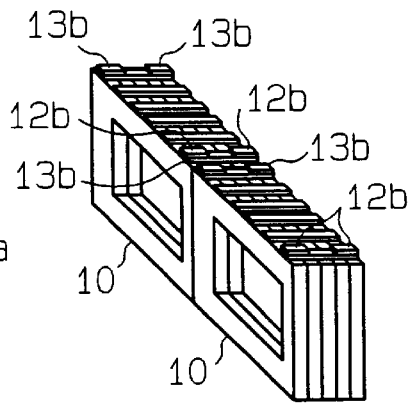

Thereafter, the substrate bodies 10 are cut in a manner shown in FIG. 5B, and signal electrodes 11 and auxiliary electrodes 12, 13 are formed on the respective cut substrate bodies 10 in a manner shown in FIGS. 5C and 5D.

For forming these electrodes, firstly, an appropriate mask is provided to perform screen printing of tungsten paste to form signal electrodes 11 to be connected to each terminal of the accelerometer 2 as well as first auxiliary electrodes 12a and 13a not to be connected to the terminals, in a manner shown in FIG. 5C.

Then, after changing the mask, tungsten paste for forming the second auxiliary electrodes 12b and 13b is screen printed in a manner shown in FIG. 5D. Incidentally, the second auxiliary electrodes 12b and 13b are locally print formed on a part of each of the first auxiliary electrodes 12a and 13a formed by printing of the first-level layer, i.e., selectively with respect to four corners of the electrode forming surface of the package substrate 10, as shown in the FIG. 5D.

Figure 6A:
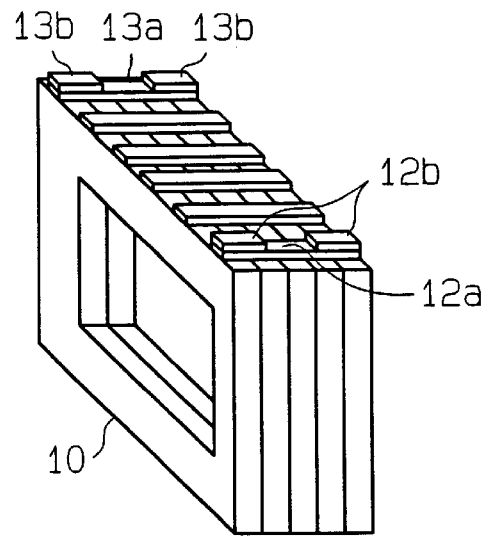
FIGS. 6A and 6B are perspective views showing the manufacturing process for the package.

Completing printing for each electrode in this manner, after firing the electrodes in batch, each package substrate body 10 is cut into individual pieces in a manner shown in FIG. 6A.

Figure 6B:
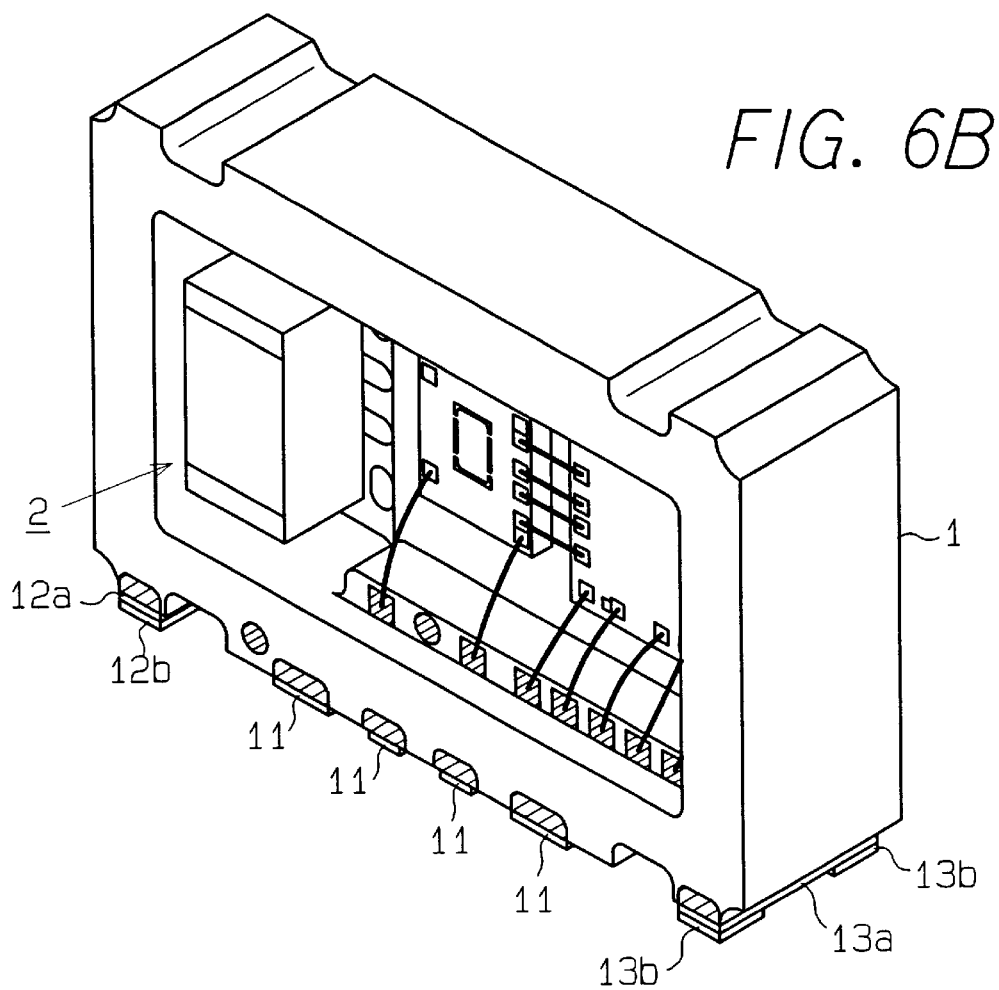

And finally, after performing desired forming as a sensor package 1, each of sensor components as stated before is assembled to the inside in a manner shown in FIG. 6B, completing the accelerometer 2.

According to the manufacturing method for a sensor package as stated, it becomes possible to stably obtain a package structure realizing the aforementioned highly reliable surface mounting through extremely easy and efficient treatment wherein printing of electrode material is basically repeated only twice.

Furthermore, according to the manufacturing method, it also becomes possible to arbitrarily adjust the solder thickness between the signal electrodes 11 and the corresponding lands 31 (FIG. 1) by controlling the film thickness of the second auxiliary electrode 12b and 13b during the second printing.

Figure 7:
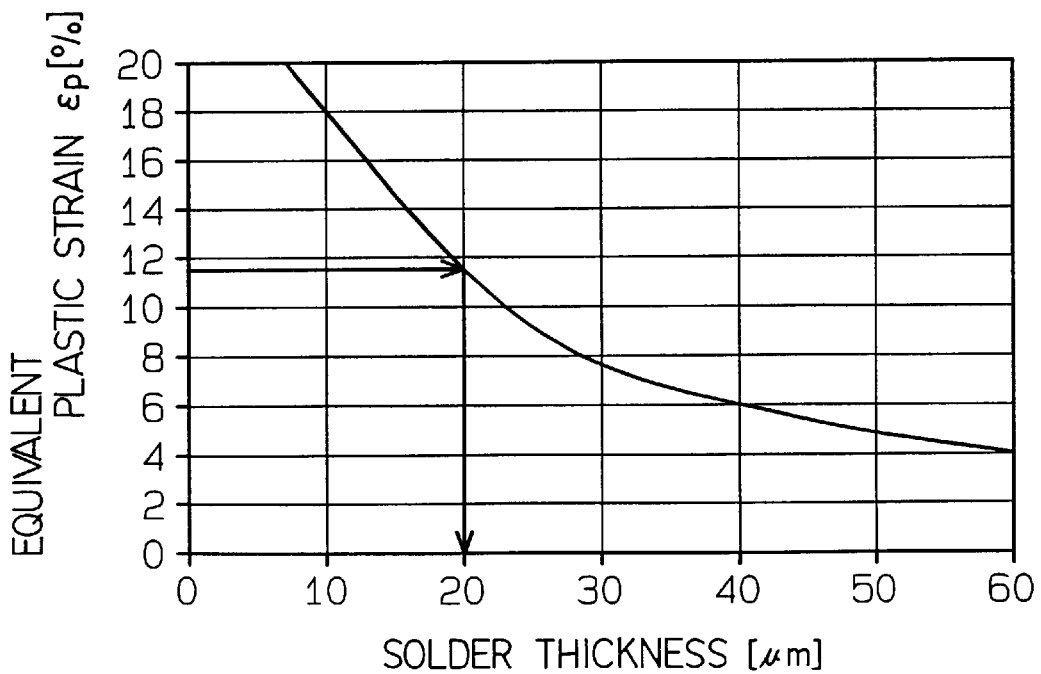
FIG. 7 is a graph showing a relation of solder thickness and equivalent plastic strain.

In this case, it is clear from FIG. 7 that if the thickness of 20 $\mu$m or greater is secured for the solder thickness, reliability is secured to a degree of nearly complete reliability for existing surface mount components.

FIG. 7 represents the relation between solder thickness and equivalent plastic strain. According to FIG. 7, it will be understood that the equivalent plastic strain increases and the reliability of soldering lowers as the solder thickness decreases. Further, it is empirically confirmed that if the equivalent plastic strain is less than approximately 11.5%, i.e., approximately 20 $\mu$m or greater in solder thickness, reliability is secured at the joined portion.

Also, in the above manufacturing method, the mount accuracy is naturally enhanced by selectively forming the second auxiliary electrode 12b and 13b with respect to the four corners in the electrode forming surface, as was shown in FIG. 5D.

That is, by making the auxiliary electrodes 12 and 13 in such an electrode structure, the balance of resting is provided through the second auxiliary electrodes 12b and 13b formed at the four corners during mounting by positioning the sensor package 2 onto the printed board 3. Thereafter, during which time each electrode 12 and 13 and the corresponding land 32 and 33 on the print board 3 are bonded by the aforementioned solder reflow, the resting balance is maintained through smaller contact area by these second auxiliary electrodes 12b and 13b. As a result, there naturally is less occurrence of such inconvenience that the package 1 is mounted in an inclined state resulting from variation in amount of flowing melt solder. Particularly for an accelerometer, it is important that the acceleration detecting axis denoted as the arrow F1 in FIG. 2 is accurately brought into settlement, and the acceleration detecting axis F1 can become to be set with accuracy by the above-stated mount structure of the package 1. That is, there is less occurrence of inclination as denoted by the arrows F2 or F3 in FIG. 2. Nevertheless, for an accelerometer, the inclination toward the direction of the arrow F2 is allowable to a certain extent.

Figure 8:
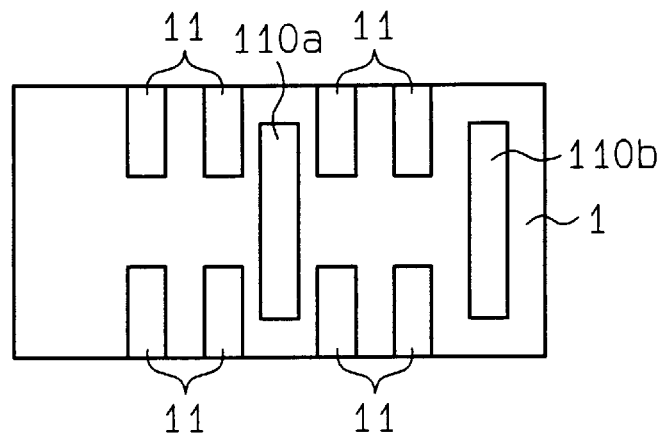
FIG. 8 is a plan view showing a first arrangement example of auxiliary electrodes.
Figure 9:
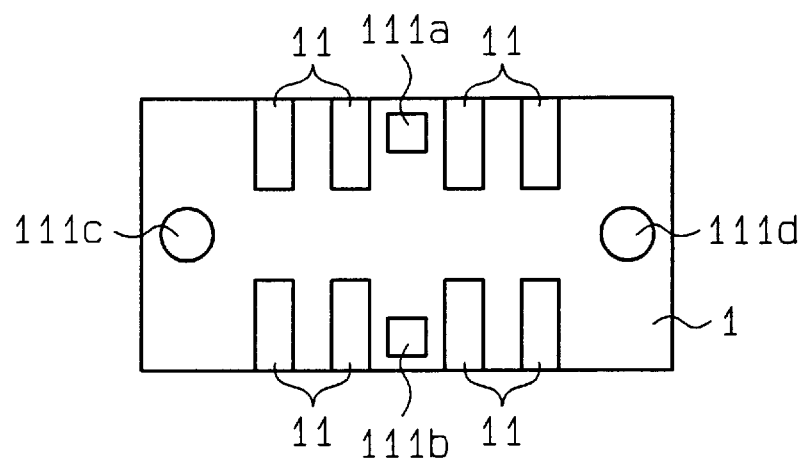
FIG. 9 is a plan view showing a second arrangement example of auxiliary electrodes.
Figure 10:
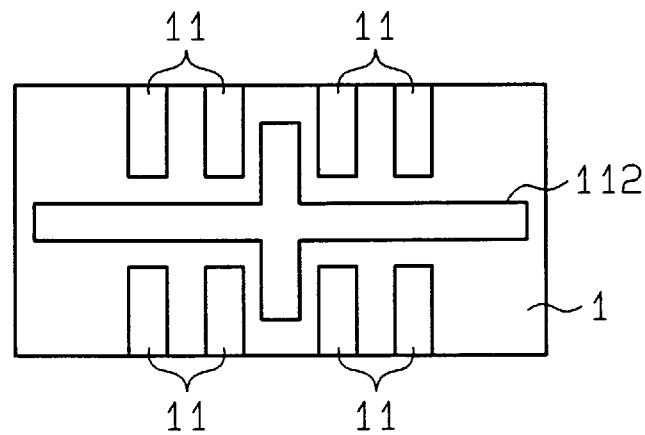
FIG. 10 is a plan view showing a third arrangement example of auxiliary electrodes.
Figure 11:
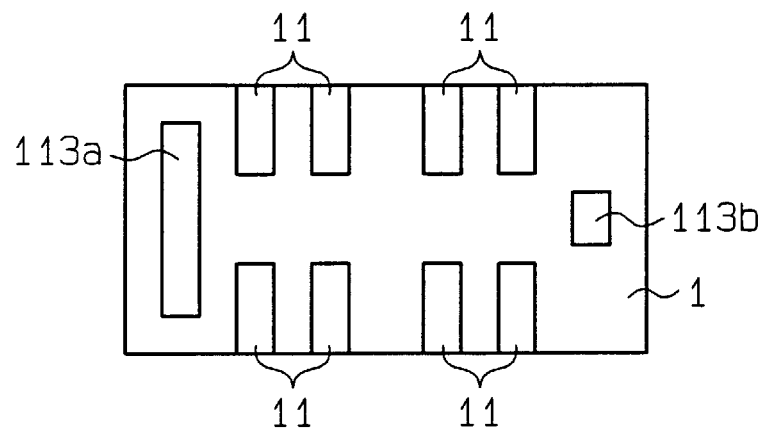
FIG. 11 is a plan view showing a fourth arrangement example of auxiliary electrodes.
Figure 12:
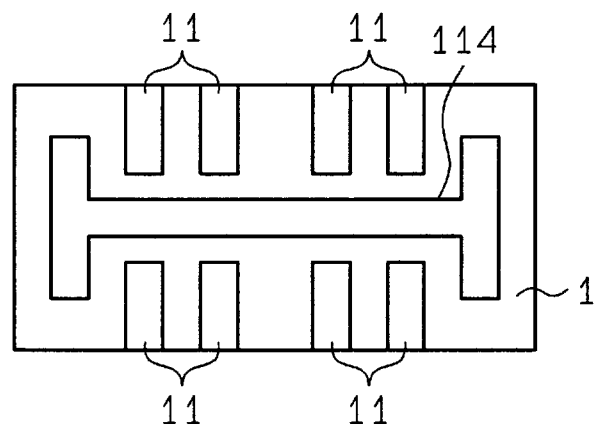
FIG. 12 is a plan view showing a fifth arrangement example of auxiliary electrodes.
Figure 13:
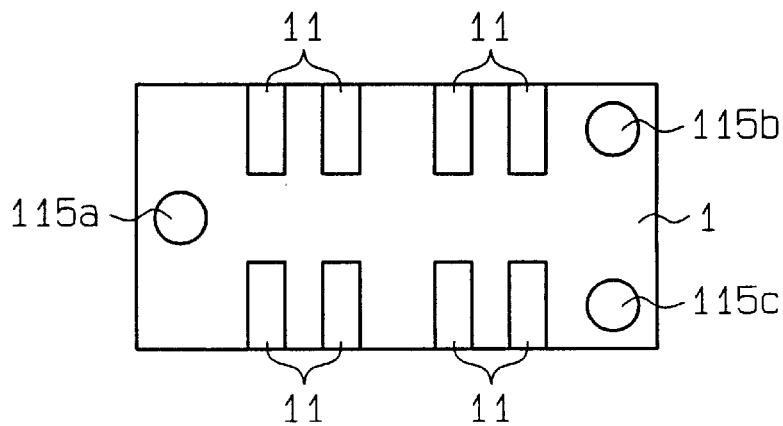
FIG. 13 is a plan view showing a sixth arrangement example of auxiliary electrodes.

With further reference to this point, the lowering in sensitivity in the direction to detect acceleration is suppressed by securing the stability of the package 1 to the printed board 3 to stabilize the acceleration detecting axis F1. That is, the auxiliary electrodes 12, 13 are determined of their shape or the location of placement or the number of arrangement such that the package 1 becomes perpendicular to the printed board 3 when a package 1 having auxiliary electrodes 12, 13 thicker than the thickness of the signal electrode 11 is placed on the printed board 3. Specifically, although FIGS. 6A and 6B show the case where the squared auxiliary electrodes 12, 13 are arranged at the four corners in the underside of the package 1. Besides this structure, belt-formed auxiliary electrodes 110a, 110b as shown in FIG. 8 may be placed, which is relative to the signal electrodes 11 in the underside of the package 1 or squared auxiliary electrodes 111a, 111b and circular auxiliary electrodes 111c, 111d may be placed as shown in FIG. 9. Also, a cross-shaped auxiliary electrode 112 as shown in FIG. 10 may be placed relative to the signal electrodes 11 in the underside of the package 1 or a band-shaped auxiliary electrode 113a and a squared auxiliary electrode 113b may be placed as shown in FIG. 11. Furthermore, as shown in FIG. 12 an I-shaped auxiliary electrode 114 may be placed relative to the signal electrodes 11 in the underside of the package 1. Also, as shown in FIG. 13 circular auxiliary electrodes 115a, 115b, 115c may be placed, or as shown in FIG. 14 an auxiliary electrode 116 may be placed in a region free of signal electrodes 11.

As a result, it is possible to prevent the package 1 from inclining in the direction of F3 in FIG. 2. If the inclination of the package toward the F3 direction can be prevented, the following merit is available.

There is necessity in the accelerometer that the detecting axis (axis of sensitivity) is in parallel with the substrate mounting surface (underside surface in FIG. 2) of the package 1. Even if the package 1 be inclined toward the F2 direction, there is no change undergone in the direction of the detecting axis and no effect is given by the inclination of the package 1. On the contrary, where the package 1 is inclined toward the F3 direction in FIG. 2, there is change in the direction of the detecting axis by the inclination of the package 1 and the detecting axis has a direct effect of gravity G in an amount of the variation (i.e., G×sin θ, where θ is the angle of inclination). Particularly, where used as a sensor for ABS (anti-lock brake system) or for suspension control, the detecting acceleration thereof is in the range of approximately±1 G and susceptible to bad influence due to the inclination. However, in the present embodiment, the package 1 can be prevented from being inclined in the F3 direction, so that acceleration in the direction of the sensitivity axis can accurately be detected.

As described above, the transducer assembly can be obtained by mounting the sensor package 1 on the printed board 3. The transducer assembly has not only a remarkably simple structure, but also high reliability of the solder bonding and good sensitivity in a direction to detect acceleration.

Incidentally, where the package 1 is inclined simultaneously in the F2 direction and the F3 direction in FIG. 2, since the package 1 is inclining also in the F3 direction, the effect is substantially the same as if the package were inclined only in the F3 direction.

Also, according to such an electrode structure of the auxiliary electrodes 12 and 13, when lands 32 and 33 are additionally provided on the printed board 3 as shown in FIG. 1, an appropriate solder thickness is secured even at portions where the first auxiliary electrodes 12a and 13a are exposed, with the result that the mount strength is further raised. Considering that the present accelerometer is to be installed on a moving body such as an automobile, that is, considering that it is to be used in an environment of frequent vibration, there is nothing better than high mount strength.

As explained hereinbefore, according to the surface-mount type semiconductor package unit and the transducer assembly using the same according to the first embodiment, (a) even with a high self-weighted package there is no reduction in solder thickness at a joined portion between the signal electrode 11 and the corresponding land 31 on the printed board 3, and it is possible to surface mount the package 1 with high reliability. In addition to increasing the thickness of solder between this package 1 and the printed board 3 to improve the life of the solder bond, the lowering of acceleration detection sensitivity can be avoided by stabilizing the acceleration detection axis (axis of sensitivity) F3 and by securing the stability of the package 1 to the printed board 3.

(b) Also, accordingly, the transducer assembly having the package structure according to the present invention can be adopted with sufficient allowance for a semiconductor device package, such as a sensor package for an accelerometer mounted upright to orient the detecting axis and requiring a high degree reliability, even under severe environmental temperature change or vibration.

(c) Furthermore, since such a mount structure is realized based on the electrode structure of the package itself without necessity of auxiliary members such as balls or spacers or the like, there is no imposition in cost bearing and mounting is extremely easy.

(d) Also, since the auxiliary electrodes 12 and 13, as the electrode structure, each are of a two-layer structure having the first auxiliary electrodes 12a and 13a with a thickness equal to the signal electrode 11 and the overlying second auxiliary electrodes 12b and 13b, it is possible to arbitrarily adjust the thickness of solder between the signal electrode 11 and the corresponding land 31 through the film thickness of the second auxiliary electrodes 12b and 13b.

(e) And by setting the film thickness of the second auxiliary electrodes 12b and 13b to 20 μm or greater, the reliability is appropriately secured nearly to the same degree as the reliability provided to the existing surface mount component regardless of self-weight of the package 1.

(f) Meanwhile, as for the second auxiliary electrodes 12b and 13b they are selectively formed with respect to the four corners in the electrode formation surface so that the balance of resting thereof is well maintained even during carrying out of solder reflow, improving the accuracy of mounting of the package 1.

(g) Also, by virtue of the electrode structure like this, an appropriate thickness of solder is secured between the first auxiliary electrode 12a and 13a and the corresponding land 32 and 33, further raising the strength of mounting.

(h) Thermal stresses can be suppressed to a minimal degree between the package and each electrode by the use of materials with a close linear expansion coefficient, e.g., a ceramic substrate is employed as a material for the package 1 while tungsten is used as a material for each of the signal electrodes 11 and auxiliary electrode 12. The reliability for the joined portions can be raised further in cooperation with the package structure.

In this manner, many excellent effects are available.

Also, according to the manufacturing method for the package as stated above, (i) it is possible to stably obtain the package structure realizing highly reliable surface mounting through extremely easy and efficient treatment requiring basically only twice repetition of electrode-material printing processes.

Extremely desirable effects are brought for a method of manufacturing such a surface-mount type semiconductor package.

Incidentally, although in the semiconductor package unit shown in FIG. 6 the second auxiliary electrodes 12b and 13b are selectively formed only at the four corners in the electrode formation surface, as for these second auxiliary electrodes 12b and 13b they may be formed as electrodes having the same size as the first auxiliary electrodes 12a and 13a. The resting balance of the package becomes maintained by selectively forming at least the auxiliary electrodes 12 and 13 nearby the shorter side portion of the package 1 which is to be uprightly mounted. That is, thereafter, when each electrode and the corresponding land on the printed board 3 are bonded by the above-mentioned solder reflow, the stabilized resting balance is at least minimally maintained through relatively small contact areas solely by the auxiliary electrodes 12b and 13b formed nearby these shorter side portions.

Also, although the first embodiment showed the case that the package structure according to the present invention is applied to a sensor package for an accelerometer, the above structure is similarly applicable to a sensor package for a dynamic parameter sensor, such as a vibration sensor, yaw-rate sensor, etc., incorporating a beam-structured detecting element arranged perpendicular to the direction of the dynamic parameter to be detected. And, according to the package structure, for such sensor packages having increased self-weight per unit area by upright mounting, it becomes possible to preferably secure the solder thickness at the joined portion between the signal electrode and the corresponding land and eventually to preferably avoid the lowering in reliability due to thinning of the solder thickness.

Figure 16A:
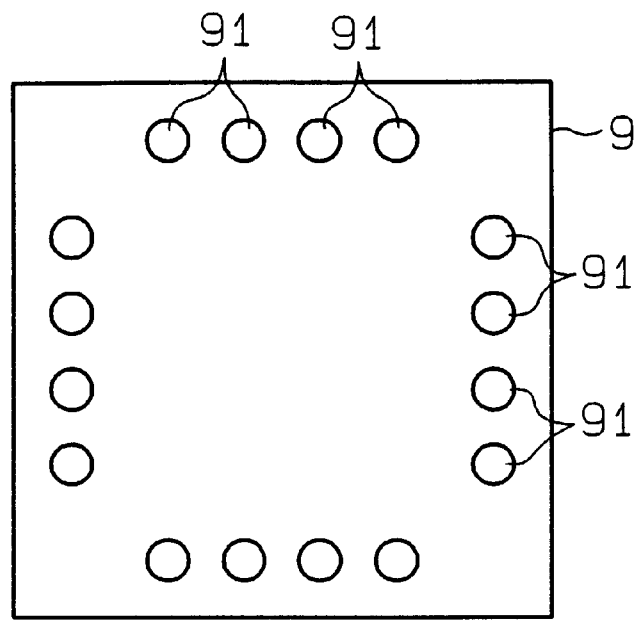
FIGS. 16A and 16B are bottom and front views showing a package structure of a conventional surface mount type component.
Figure 16B:
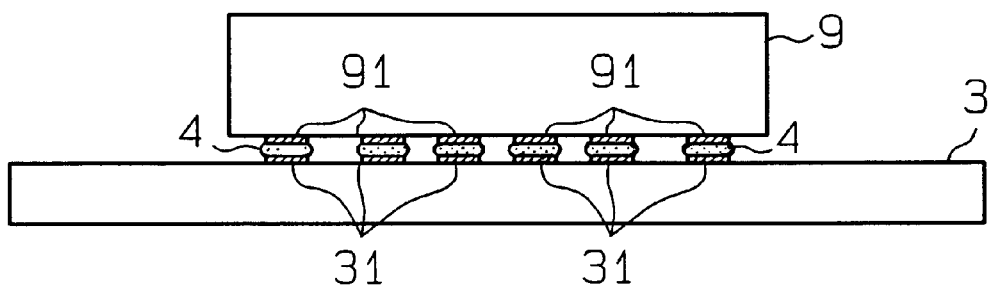

Also, the package structure according to the present invention is not limited to these sensor packages, but is applicable similarly to a surface-mount type component such as a multi-chip module or a large-area semiconductor chip as exemplified in FIGS. 16A and 16B hereinbefore. In FIGS. 15A and 15B, structural examples are shown for the case where the package structure of the present invention is applied to a semiconductor chip exemplified in FIGS. 16A and 16B.

That is, even for such a large-area semiconductor chip, auxiliary electrodes 92a, 92b to 95a, 95b are provided at appropriate locations in the bottom surface corner portions thereof, and the structure of these auxiliary electrode are provided, as shown for example in FIGS. 15A, as two-layer structure having first auxiliary electrodes 92a, 93a, 94a, and 95a, which have the same film thickness as the signal electrode 91 and film-layered on a semiconductor package 9, and second auxiliary electrodes 92b, 93b, 94b, and 95b stack film-layered over these first auxiliary electrodes.

With such a structure, when the semiconductor package 9 is rested on a printed board, it is possible to form "auxiliary electrode thickness–signal electrode thickness" between the signal electrode 91 and the corresponding land on the printed board, i.e., a gap corresponding to the film thickness of the second auxiliary electrode 92b, 93b, 94b, and 95b, and it becomes possible to arbitrarily adjust the solder thickness between the signal electrode 91 and the corresponding land.

And furthermore, as shown in FIG. 15B, as for the second auxiliary electrode 92b, 93b, 94b, and 95b they are locally stack formed on part of the corresponding first auxiliary electrode.

If such an electrode structure is adopted, the lowering of mount accuracy due to variations in amount of solder reflow is preferably suppressed, and when lands corresponding to these auxiliary electrodes are additionally provided on the printed board, preferred solder thickness is secured even at portions where the first auxiliary electrodes 92a, 93a, 94a, and 95a are exposed, further raising the mount strength.

Incidentally, although for such a package structure the additional provision of the lands on the printed board correspondingly to the auxiliary electrodes is effective for enhancing the mount strength or securing the increased solder thickness between the signal electrode and the corresponding land on the printed board as stated above, it is not essential for the assembly to arrange lands correspondingly to the auxiliary electrodes on the printed board side.

That is, the auxiliary electrode per se does not provide electrical contribution so that there is no inconvenience even if the auxiliary electrode, after being mounted onto the printed board, be in electrical suspension. Also, despite the fact that auxiliary electrode lands are additionally provided on the printed board correspondingly to the auxiliary electrodes, the present invention lies in the first place in securing the solder thickness between the signal electrode and the corresponding land by the sacrifice of solder joint at the auxiliary electrode portion so that the reliability of the auxiliary electrode portion may be satisfactorily low. And, as long as the solder thickness between the signal electrode and the corresponding land is sufficiently secured as stated above, the necessary and satisfactory reliability are secured at the joined portion and the sufficient mount strength of the package can be obtained even if solder bonding is not necessarily done at the auxiliary electrode portion.

Conversely, if the provision of the auxiliary electrode lands corresponding to the auxiliary electrodes are omitted, it becomes possible to use a printed circuit board for a conventional semiconductor package unit having no auxiliary electrodes. However, the signal electrodes which are electrically connected to each terminal of the semiconductor device incorporated in the semiconductor package and the auxiliary electrodes may be electrically connected as long as adverse short-circuit of the signal electrodes can be avoided.

Also, in the semiconductor package unit exemplified above, the auxiliary electrode is formed into the two-layer structure to secure a film thickness thicker than the signal electrode.

However, so long as the relation in film thickness can be satisfied between the signal electrode and the auxiliary electrode, it is possible to adopt as the auxiliary electrode an one-layer structure or an arbitrary structure of three-layer or more.

Also, in the manufacturing method, the electrodes involving the signal electrodes were formed by screen printing, but the forming technique is arbitrary. Besides, these electrodes can also be formed by using techniques such as for example pad printing, plating, hot-stamping (adhesion), and so on.

Also, the materials adopted for the semiconductor package or the electrodes thereof are arbitrary without being limited to the above ceramic substrate or tungsten. Resins, liquid crystal polymers (LCP), glasses, etc. may alternatively be adopted for a package material, and copper, silver, gold, silver platinum, silver palladium, aluminum, nickel, etc., may alternatively adopted for an electrode material.

Next, the third embodiment of the present invention will be described with reference to FIG. 17.

In the first and second embodiments, auxiliary electrodes are formed to have a film thickness thicker than that of the signal electrodes 11 to secure a sufficient solder thickness between the signal electrode and the corresponding land. As a result, a lifetime of the solder can be lengthened. Further, because the auxiliary electrode is formed at the periphery of the mount surface of the package, it is possible to stabilize the sensitivity of the sensor installed in the package. The unit structure according to the third embodiment can obtain the same effects as the above-mentioned embodiments without specifying a relationship between the film thickness of the auxiliary electrode and the film thickness of the signal electrode.

Hereinafter, only differences between the third embodiment and the first embodiment will be described and the explanation about the same assembling method, the same structure and the like is omitted by giving the same numerals as the first embodiment.

FIG. 17 is a front view of a surface mount type package structure according to a third embodiment of the present invention. According to this package structure, the auxiliary member as described before and the auxiliary electrodes is not necessary. In more detail, projecting portions 100 are provided to a package surface so that the projecting portions 100 project to a circuit board 3 side from the package surface for signal electrodes 11 to be formed on. When the package is disposed on the circuit board, the projecting portions 100 contact with the circuit board 3. As a result, when the package 1 is fixed to the circuit board 3, sufficient solder thickness is secured between the signal electrode 11 and a corresponding land 31. Therefore, the lifetime of the solder can be lengthened. In addition, because the projecting portions 100 is formed at the periphery of the package surface, it is possible to stably mount the package 1 on the circuit board 3. Therefore, the sensitivity axis of the sensor does not deviate from a desirable direction.

It is to be noted that the number, the shape and the place to be formed of the projecting portion 100 can be arbitrarily designed as shown in FIG. 8 to FIG. 14 and the projecting portion 100 may be formed on the circuit board 3.

Further, it is needless to say that the auxiliary member or the auxiliary electrode can be disposed in addition to the projecting portions 100 shown in FIG. 17.

It is further to be noted that the surface forming the projecting portion is not limited to the package surface for the signal electrodes 11 to be formed. That is, the projecting portions may be formed on the side surfaces of the package 1. In this case, before the firing of the package 1, printed films made of alumina or glass is formed on the side surface of the package by a conventional printed method so as to project to the circuit board 3. Or, after the firing of the package 1, printed films made of resin or silk is formed on the side surface of the package. Further, the projecting portions may be formed by adhering resin tape on the side surface of the package 1, In any cases of the above, the same effects as the third embodiment can be obtained.

In the above embodiments, sensor 2 is housed in the package 1. However, a sensor, device, semiconductor device can be can be directly mounted on the circuit board as a surface mount type unit with the same structure as described before.

What is claimed is:

1. A surface mount type unit in which a surface mount type device is surface-mounted on a circuit board through a conductive element, the surface mount type unit comprising:
    a first electrode provided on a surface of said surface mount type device and electrically connected to a circuit in said surface mount type device; and
    a second electrode provided on said surface of said surface mount type device, said second electrode being formed of a material that is the same as that of the first electrode with a thickness greater than that of said first electrode,
    wherein said conductive element includes a conductive bonding element, and said conductive bonding element is disposed at a space between said circuit board and said first electrode, said space being formed by a difference in thickness between said first electrode and said second electrode.

2. A surface mount type unit as recited in claim 1, wherein said second electrode comprises a two-layer structure having a first auxiliary electrode formed on said surface of said surface mount type device so as to have the same thickness as said first electrode and a second auxiliary electrode formed overlying said first auxiliary electrode.

3. A surface mount type unit as recited in claim 2, wherein said surface mount type device includes a dynamic parameter detecting element and is arranged so that a detection axis of said dynamic parameter detecting element is in parallel to said surface of said surface mount type device.

4. A surface mount type unit as recited in claim 2, wherein said second auxiliary electrode has a thickness of 20 $\mu$m or greater.

5. A surface mount type unit as recited in claim 4, wherein said surface mount type device includes a dynamic parameter detecting element and is arranged so that a detection axis of said dynamic parameter detecting element is in parallel to said surface of said surface mount type device.

6. A surface mount type unit as recited in claim 1, wherein said second electrode is selectively formed with respect to peripheral portion of said surface of said surface mount type device.

7. A surface mount type unit as recited in claim 6, wherein said surface mount type device includes a dynamic parameter detecting element and is arranged so that a detection axis of said dynamic parameter detecting element is in parallel to said surface of said surface mount type device.

8. A surface mount type unit as recited in claim 1, wherein said surface mount type device includes a dynamic parameter detecting element and is arranged so that a detection axis of said dynamic parameter detecting element is in parallel to said surface of said surface mount type device.

9. A surface mount type unit as recited in claim 8, wherein said surface mount type device is mounted on the circuit board in an upright orientation defining a first side and a second side shorter than said first side and wherein said second electrode is selectively formed close to said second side of said surface of said surface mount type device.

10. A surface mount type unit as recited in claim 9, wherein said second electrode comprises a two-layer structure having a first auxiliary electrode formed on said surface of said surface mount type device so as to have the same thickness as the first electrode and a second auxiliary electrode formed overlying said first auxiliary electrode, said second auxiliary electrode being selectively formed with respect to at least four corners of said surface of the surface mount type device to be mounted upright.

11. A transducer assembly having a surface mount type device which fixes a transducer chip having an axis of sensitivity perpendicular to a surface of said transducer chip, said transducer assembly comprising:
    a conductive element formed on a surface of said surface mount type device perpendicular to said surface of said transducer chip, for taking out an output signal of said transducer chip from said surface mount type device;
    a circuit board to arrange said surface mount type device thereon so that a surface of said circuit board faces to said surface of said surface mount type device in a state that said axis of sensitivity is in parallel with said surface of said circuit board;
    an auxiliary element formed of a material that is the same as that of said conductive element on said surface of said surface mount type device, wherein said auxiliary element has a thickness greater than the thickness of said conductive element and is selectively provided between said surface of said surface mount type device and said surface of said circuit board; and
    a conductive bonding element disposed at a space between said circuit board and said conductive element, said space being formed by a difference in thickness between said conductive element and said auxiliary element.

12. A transducer assembly as recited in claim 11, wherein said surface mount type device is made from one of a laminated ceramic substrate, resin, liquid crystal polymer and glass.

13. A transducer assembly using a surface mount type device which fixes a transducer chip having an axis of sensitivity perpendicular to a surface of said transducer chip, said transducer assembly comprising:
    a first conductive element for taking out an output signal of said transducer chip to a surface of said surface mount type device;
    a circuit board to arrange said surface mount type device thereon and to receive said output signal through a second conductive element formed thereon;

an auxiliary conductive element selectively placed between said surface of said surface mount type device and a surface of said circuit board, said auxiliary conductive element being formed of a material that is the same as that of said first conductive element and having a thickness greater than the thickness of said first conductive element; and a conductive bonding element which bonds said first conductive element and said second conductive element together in a state that said axis of sensitivity is in parallel with said surface of the circuit board.

14. A transducer assembly as recited in claim 13, wherein said surface mount type device is made from one of a laminated ceramic substrate, resin, liquid crystal polymer and glass.

15. A surface mount type unit comprising:

a circuit board;

a surface mount type device which is to be surface-mounted on said circuit board;

a first conductive element formed on a surface of said surface mount type device;

a conductive bonding element which is disposed at a space between said first conductive element and said circuit board to electrically connect said circuit board and said surface mount type device; and a second conductive element which is formed of a material that is the same as that of said first conductive element on said surface of said surface mount type device to control a thickness of said conductive bonding element.

16. A surface mount type unit as recited in claim 15, further comprising:

a dynamic parameter detecting element of which a sensitivity axis is at a certain angle with respect to a surface thereof, wherein said dynamic parameter detecting element is fixed to said surface mount type device so that said sensitivity axis is set to be in a desirable angle relation with respect to a surface of said circuit board.

17. A surface mount type unit as recited in claim 16, wherein said first conductive element is to take out an output signal from said dynamic parameter detecting element.

18. A surface mount type unit as recited in claim 17, wherein said second conductive element is disposed between said surface mount type device and said circuit board and has a thickness that is greater than that of said first conductive element.

19. A surface mount type unit comprising:

a circuit board having a device mounting surface;

a surface mount type device which is to be surface-mounted on said device mounting surface of said circuit board so that a bottom surface of said surface mount type device faces toward said device mounting surface of said circuit board; and a conductive bonding element which is interposed between said device mounting surface of said circuit board and said bottom surface of said surface mount type device to electrically connect said circuit board and said surface mount type device, wherein either one of said device mounting surface and said bottom surface is formed to partially project toward an opposing surface, to control a thickness of said conductive bonding element, and wherein said surface mount type device and said circuit board make contact to each other through a projecting portion formed on either one of said device mounting surface and said bottom surface.

20. A surface mount type unit as recited in claim 19, further comprising:

a dynamic parameter detecting element of which a sensitivity axis is at a certain angle with respect to a surface thereof, wherein said dynamic parameter detecting element is fixed to said surface mount type device so that said sensitivity axis is set to be in a desirable angle relation with respect to said device mounting surface of said circuit board.

21. A transducer assembly as recited in claim 11, wherein said conductive element and said auxiliary element are formed by printing.

22. A transducer assembly as recited in claim 13, wherein said conductive element and said auxiliary element are formed by printing.

23. A surface mount type unit as recited in claim 17, wherein said first and second conductive elements are formed by printing.

24. A surface mount type unit comprising:

a circuit board having a device mounting surface;

a surface mount type device which is to be surface-mounted on said device mounting surface of said circuit board so that a bottom surface of said surface mount type device faces toward said device mounting surface of said circuit board;

a conductive element including a first conductive electrode and a conductive bonding element, which are interposed in series between said device mounting surface of said circuit board and said bottom surface of said surface mount type device to electrically connect said circuit board and said surface mount type device; and an auxiliary element including at least a second conductive electrode formed of a material that is the same as said first conductive electrode and interposed between said device mounting surface of said circuit board and said bottom surface of said surface mount type device, wherein a thickness of said second conductive electrode is greater than that of said first conductive electrode so that a space in which said conductive bonding element is disposed is ensured by a difference in thickness between said first conductive electrode and said second conductive electrode.

25. A surface mount type unit according to claim 24, wherein said auxiliary element includes a conductive bonding element in addition to said second conductive electrode, and said conductive bonding element and said second conductive electrode are interposed in series between said device mounting surface of said circuit board and said bottom surface of said surface mount type device.

* * * * *